United States Patent
Tatani

(10) Patent No.: US 8,298,851 B2
(45) Date of Patent: Oct. 30, 2012

(54) METHOD OF MANUFACTURING A SOLID-STATE IMAGING DEVICE WITH A SILICIDE BLOCKING LAYER AND ELECTRONIC APPARATUS

(75) Inventor: Keiji Tatani, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/425,898

(22) Filed: Apr. 17, 2009

(65) Prior Publication Data

US 2009/0261392 A1 Oct. 22, 2009

(30) Foreign Application Priority Data

Apr. 21, 2008 (JP) ................................. 2008-110669

(51) Int. Cl.
*H01L 21/00* (2006.01)
*H01L 31/062* (2012.01)
*H01L 31/113* (2006.01)

(52) U.S. Cl. .............. 438/73; 438/48; 438/59; 257/290; 257/292; 257/E27.132

(58) Field of Classification Search ........................ None
See application file for complete search history.

(56) References Cited

U.S. PATENT DOCUMENTS

| 6,642,076 | B1 | 11/2003 | Yaung et al. | |
| 7,235,835 | B2* | 6/2007 | Nagano et al. ................ | 257/296 |
| 2004/0094784 | A1 | 5/2004 | Rhodes et al. | |
| 2006/0001062 | A1* | 1/2006 | Jeon .............................. | 257/292 |
| 2006/0125007 | A1* | 6/2006 | Rhodes ......................... | 257/346 |
| 2006/0192250 | A1* | 8/2006 | Lee ................................ | 257/338 |
| 2007/0023802 | A1* | 2/2007 | Oh et al. ....................... | 257/292 |
| 2009/0008688 | A1* | 1/2009 | Park et al. .................... | 257/292 |
| 2009/0057735 | A1* | 3/2009 | Beak et al. ................... | 257/292 |

FOREIGN PATENT DOCUMENTS

| EP | 1617480 | 1/2006 |
| JP | 2001-345439 | 12/2001 |
| JP | 2005-223085 | 8/2005 |
| JP | 2005-260077 | 9/2005 |

OTHER PUBLICATIONS

European Search Report corresponding to European Serial No. 09004393.6 dated Aug. 6, 2009.
Japanese Patent Office Action corresponding to Japanese Serial No. 2008-110669 dated Jun. 15, 2010.

* cited by examiner

*Primary Examiner* — N Drew Richards
*Assistant Examiner* — Michael Jung
(74) *Attorney, Agent, or Firm* — SNR Denton US LLP

(57) ABSTRACT

A solid-state imaging device is provided. The solid-state imaging device includes a pixel section, a peripheral circuit section, a silicide blocking layer formed in the pixel section except for part or whole of an area above an isolation portion in the pixel section, and a metal-silicided transistor formed in the peripheral circuit section.

3 Claims, 14 Drawing Sheets

METHOD OF MANUFACTURING A SOLID-STATE IMAGING DEVICE WITH A SILICIDE BLOCKING LAYER AND ELECTRONIC APPARATUS

BACKGROUND OF THE INVENTION

1. Field of the Invention

The present invention relates to a solid-state imaging device and a method of manufacturing such a solid-state imaging device, and also relates to an electronic apparatus including the solid-state imaging device.

2. Description of the Related Art

Solid-state imaging devices can be generally classified into those of an amplification-type typified by CMOS (Complementary Metal Oxide Semiconductor) image sensor and those of a charge-transfer type typified by CCD (Charge Coupled Device) image sensors. These solid-state imaging devices have been widely used for digital still cameras, digital video cameras, and so on. Furthermore, in recent years, CMOS image sensors have mainly been used for solid-state imaging devices mounted on mobile devices such as camera cell-phones and PDAs (Personal Digital Assistants) because of their low power voltages, low power consumption, and so on.

The CMOS solid-state imaging device includes a silicided peripheral circuit section and a silicide-free pixel section. In other words, for CMOS transistors in the peripheral circuit section, a metal silicide layer is formed on both the surface of a polysilicon gate electrode and the surface a source/drain region to attain a decrease in resistance. On the other hand, the pixel section is not silicided so as to prevent an adverse influence of electrons generated from a metal silicide layer. The metal silicide layer has many fixed electrons. When these electrons of the layer leak into a photodiode provided as a photoelectric conversion element, dark current is caused to degrade image quality. Therefore, the pixel section is prevented from being silicided. In general, a silicide blocking layer is employed to protect the pixel section when the peripheral circuit section is silicided. Covering the pixel section with the silicide blocking layer is disclosed in, for example, Japanese Unexamined Patent Application Publication No. 2005-223085 and Japanese Unexamined Patent Application Publication No. 2005-260077.

FIG. 1 and FIG. 2 are schematic diagrams that illustrate main parts of a pixel section and a peripheral circuit section of the related-art CMOS solid-state imaging device. As shown in FIG. 1, a solid-imaging device 101 includes a pixel section 103 and a peripheral circuit section 104 on a semiconductor substrate 102. The pixel section 103 includes a plurality of pixels arranged on the semiconductor substrate 102. The peripheral circuit section 104 includes a logic circuit or the like formed around the pixel section 23. The pixel section 103 includes an isolation portion 121 constructed of a fist conductivity type semiconductor layer 122 and an insulating layer (e.g., a silicon dioxide layer) 123 formed thereon. In addition, the pixel section 103 also includes a plurality of pixels 110 each constructed of a photodiode (PD) 107 provided as a photoelectric conversion element and a plurality of pixel transistors 108. Here, the pixels 110 are arranged in a matrix in a plane and are separated from one another by the isolation portions 121. In FIG. 1, only one of pixel transistors 108 is represented on behalf of all of them. The pixel transistor 108 includes a source/drain region 109, a gate insulating film (not shown), and a gate electrode (not shown).

A silicide blocking layer 111, such as a silicon nitride film, is applied to the upper part of the pixel 110 and covers the entire pixel section 103 to be protected from the influence when the CMOS transistors in the peripheral circuit section 104 is silicided as described later (see FIG. 1 and FIG. 2). A plurality of wiring layers 114 are formed above the silicide blocking layer 111. The layers 114 include a plurality of wiring lines 113 stacked with an insulating interlayer 112 in between. Furthermore, an on-chip color filter 115 and an on-chip microlens 116 are formed above the insulating interlayer 112. FIG. 2 shows a unit pixel including a photodiode (PD) 107 and three pixel transistors, i.e., a transfer transistor Tr1, a reset transistor Tr2, and an amplification transistor Tr3. The transfer transistor Tr1 includes a source/drain region 1091, which becomes a floating diffusion (FD) region with the photodiode 107, and a transfer gate electrode 161. The reset transistor Tr2 includes a pair of source/drain regions 1091 and 1092 and a reset gate electrode 162. The amplification transistor Tr3 includes a pair of source/drain region 1092 and 1093 and an amplification gate electrode 163.

In the peripheral circuit section 104, for example, there is formed an isolation portion 125 with a STI (Shallow Trench Isolation) structure obtained by filling a groove 126 of the semiconductor substrate 102 with an insulating layer 127 such as a silicon dioxide layer. A plurality of CMOS transistors 130 are formed including an n-channel MOS transistor 128 and a p-channel MOS transistor 129 separated from each other by the isolation portion 125. The n-channel MOS transistor 128 includes a pair of n-type source/drain regions 133 and 134 which are formed in a p-type semiconductor well region 132, and a gate electrode (e.g., a polysilicon film) 136 with a gate insulating film 135 in between. The p-channel MOS transistor 129 includes a pair of p-type source/drain regions 143 and 144 which are formed in an n-type semiconductor well region 142, and a gate electrode (e.g., a polysilicon film) 146 with a gate insulating film 135 in between. Sidewalls (sidewall layers) 151, which are insulating layers, are formed on the side walls of the respective gate electrodes 136 and 146. The n-channel MOS transistor 128 includes source/drain regions 133 and 134. Also, the p-channel MOS transistor 129 includes source/drain regions 143 and 144. Each of the source/drain regions 133, 134, 143, and 144 includes a highly-doped region and a lightly-doped region, having a so-called LDD structure.

In addition, the n-channel MOS transistor 128 and the p-channel MOS transistor 129 formed in the peripheral circuit section 104 are metal-silicided, respectively. In other words, a metal silicide layer 152, such as a Co silicide layer, is formed on each of the surfaces of the respective source/drain regions 133, 134, 143, and 144 in addition to the surfaces of the respective gate electrodes 136 and 146.

SUMMARY OF THE INVENTION

Solid-state imaging devices may have a disadvantage in that SNR deteriorates with a decrease in pixel size. Noise may be caused by the formation of the silicide blocking layer 111 on the whole area of the pixel section 103 as shown in FIG. 2. That is, after forming the silicide blocking layer 111 all over the pixel section 103, heat treatment for silicidation in the peripheral circuit section 104 is performed. The heat treatment leads to stress between the pixel section 103 and the silicide blocking layer 111 due to warping caused by a difference between the thermal expansion coefficient of the semiconductor substrate 102 and the thermal expansion coefficient of the silicide blocking layer 111 (e.g., silicon nitride film). Electrons flow out as the stress occurs, leading to the generation of electron traps and becoming a causal factor of noise generation.

In order to suppress the generation of noise due to a silicide blocking layer, a pixel section may be designed to be free of the silicide blocking layer. However, if a metal silicide layer is formed on silicon in the pixel section, pixel property may be deteriorated because of an increase in junction leakage, dark current generation due to an influence received from the metal silicide layer, white spot generation, and so on.

Thus, solid-state imaging devices may have unsuitable pixel property due to the remaining silicide blocking layer on the pixel in the pixel section, or due to junction leakage, white spot, and so on caused by the silicidation of the pixel section.

Further, the silicide blocking layer provided also as a sidewall is temporarily removed in the pixel section as in the peripheral circuit section at a time. Then the silicide blocking layer is reattached to the pixel section, followed by silicidation. In this case, the number of steps for producing the solid-state imaging device increases.

It is desirable to provide a solid-state imaging device having an improved pixel property without an increase in the number of producing steps and to provide a method of manufacturing such a device. In addition, it is desirable to provide an electronic apparatus including such a solid-state imaging device.

According to an embodiment of the present invention, there is provided a solid-state imaging device that includes a pixel section, a peripheral circuit section, a silicide blocking layer, and a transistor. The silicide blocking layer is formed in the pixel section except for part or whole of an area above an isolation portion in the pixel section. Also, the transistor is formed in the peripheral circuit section and metal-silicided.

In the solid-state imaging device according to an embodiment of the present invention, the silicide blocking layer is formed in the pixel section except for part or whole of an area above the isolation portion in the pixel section. Thus, the surface area of the silicide blocking layer decreases, reducing the degree of warping caused by a difference between the thermal expansion of the silicide blocking layer and the thermal expansion of the semiconductor substrate. It leads to reduced warping stress, suppressing the generation of any stress-induced noise. Since no metal silicide layer is formed in the pixel section, the generation of junction leakage, dark current, and white spot can be suppressed.

According to another embodiment of the present invention, there is provided a method of manufacturing a solid-state imaging device. The method includes the step of forming a silicide blocking layer in a pixel section on which pixels each having an isolation portion, a photoelectric conversion element, and a pixel transistor are formed. The method also includes the step of selectively removing the silicide blocking layer from part or whole of an area above the isolation portion in the pixel section. Furthermore, the method includes the steps of forming a metal film in the pixel section and a peripheral circuit section and forming a metal silicide layer in the peripheral circuit section, followed by removing the residual metal film.

According to the method of manufacturing a solid-state imaging device of the embodiment of the present invention, the area covered by the silicide blocking layer can be reduced by including the step of selectively removing the silicide blocking layer from part or whole of an area above the isolation portion in the pixel section. Thus, the warping of the semiconductor substrate caused by a difference between the thermal expansion of the semiconductor substrate and the thermal expansion of the silicide blocking layer can be reduced in the subsequent thermal processing for silicidation. Furthermore, since the silicide blocking layer is formed in the area of the pixel section where it is required, the method allows the production of a solid-state imaging device in which the generation of junction leakage, dark current, and white spot are suppressed.

According to further embodiment of the present invention, there is provided an electronic apparatus that includes a solid-state imaging device, an optical system that leads incident light into a photoelectric conversion element of the solid-state imaging device, and a signal processing circuit that processes an output signal of the solid-state imaging device. Here, the solid-imaging device includes a pixel section, a peripheral circuit section, a silicide blocking layer, and a transistor. The silicide blocking layer is formed in the pixel section except for part or whole of an area above an isolation portion in the pixel section. The transistor is a metal-silicided transistor formed in the peripheral circuit section.

Since the electronic apparatus according to the above embodiment of the invention includes the solid-state imaging device according to the above embodiment of the present invention, image quality can be improved.

Therefore, according to any of the above embodiments of the present invention, the pixel property of the solid-state imaging device can be improved without increasing the number of manufacturing steps.

BRIEF DESCRIPTION OF THE DRAWINGS

FIG. 6A shows an insulation/separation structure, FIG. 6B shows a shallow-trench isolation (STI) structure, and FIG. 6C shows a diffusion isolation structure.

DESCRIPTION OF THE PREFERRED EMBODIMENTS

Hereafter, embodiments of the present invention will be described in detail with reference to the attached drawings.

Figure 1:
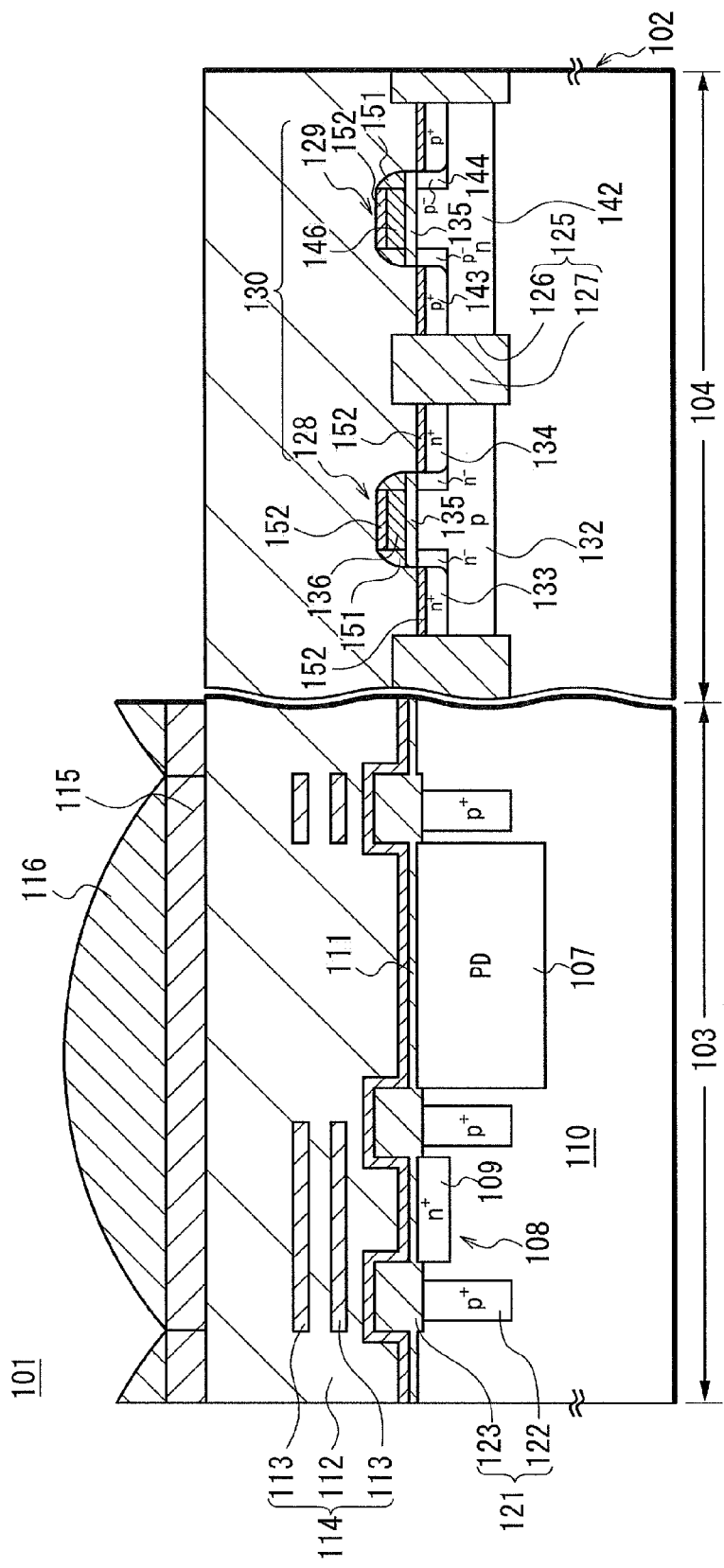
FIG. 1 is a cross-sectional view of a main part of a related-art solid-state imaging device.
Figure 2:
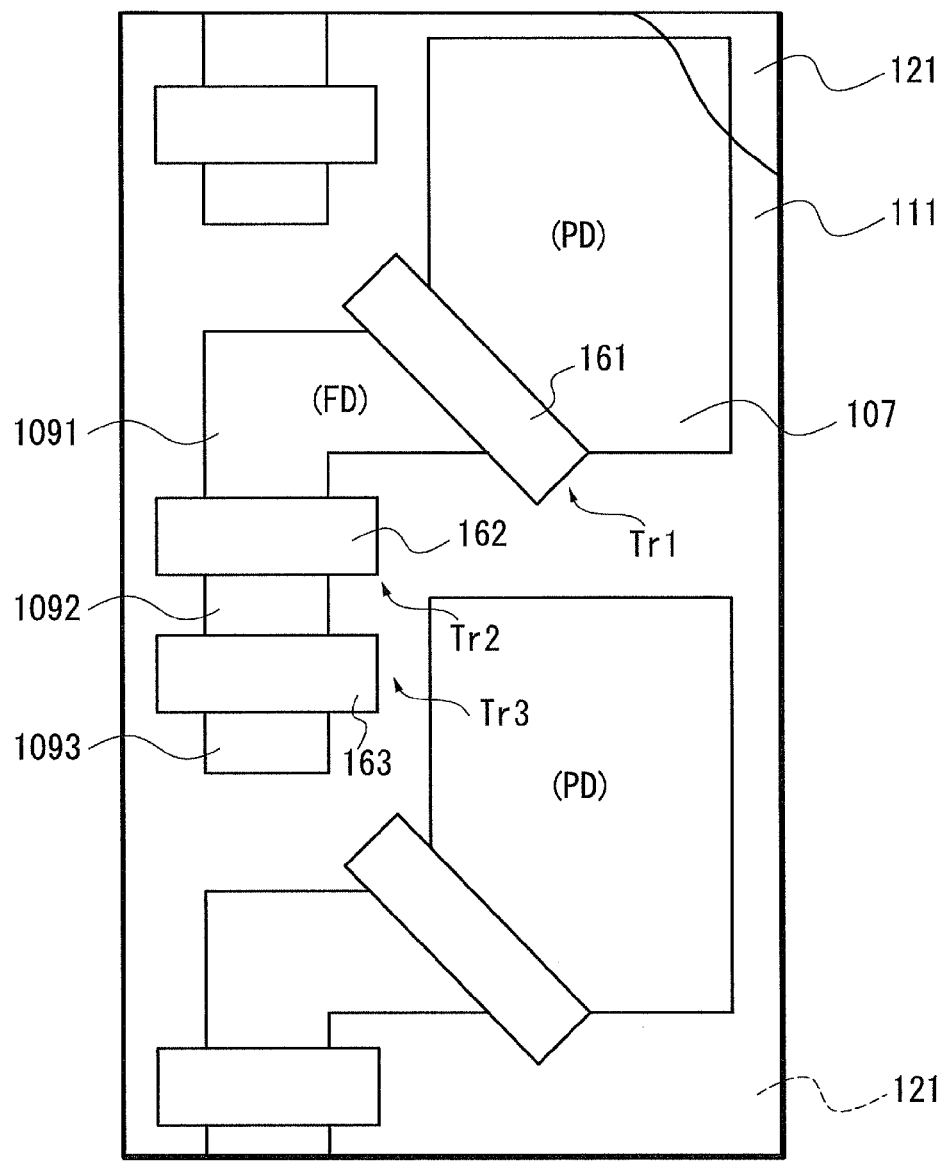
FIG. 2 is a cross-sectional view of a main part of a pixel section of the related-art solid-state imaging device.
Figure 3:
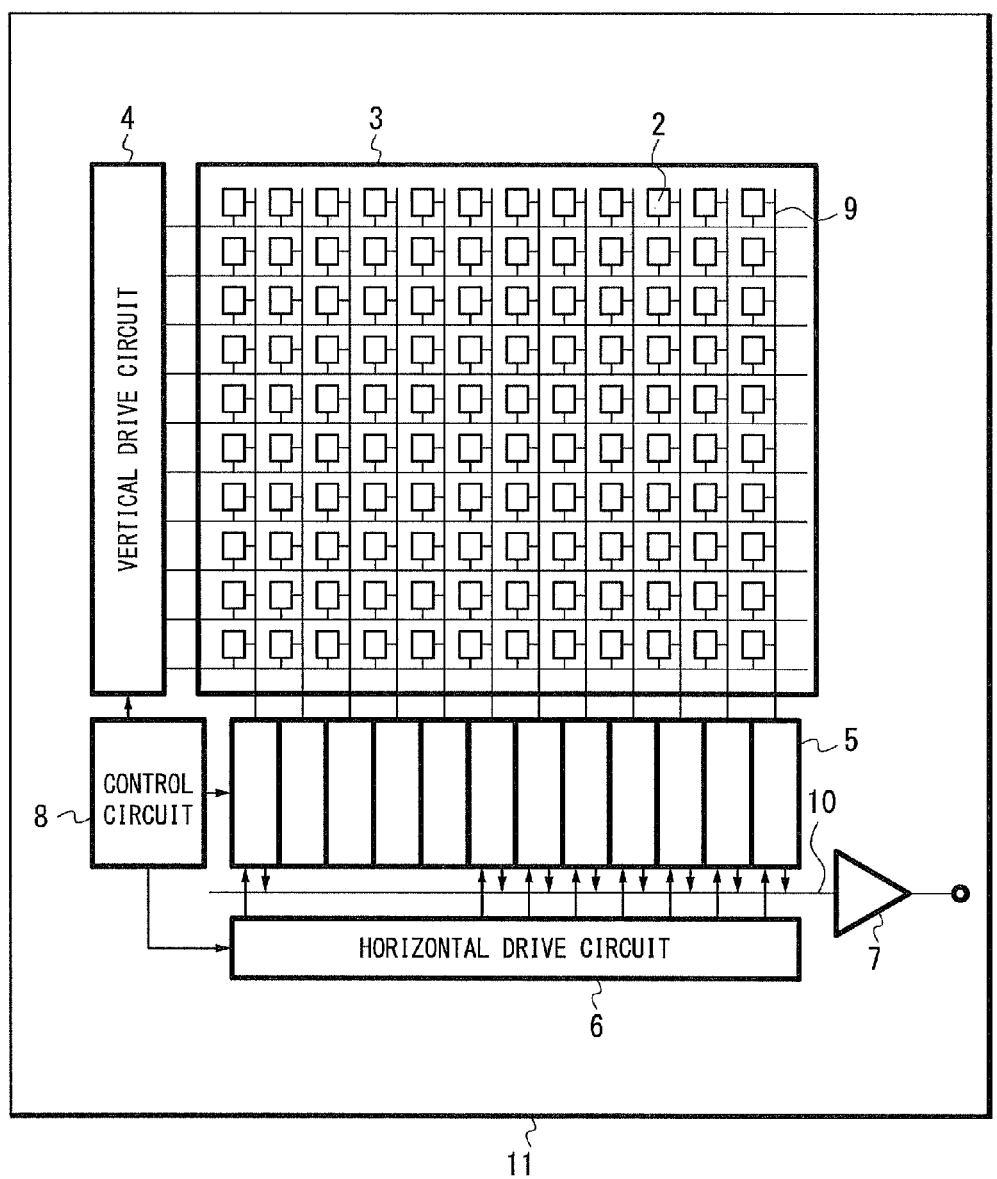
FIG. 3 is a schematic diagram illustrating an example configuration of a solid-state imaging device applied to an embodiment of the present invention.

FIG. 3 is a schematic diagram illustrating an example configuration of a solid-state imaging device, or a CMOS solid-state imaging device, which can be applied to any embodiment of the present invention. A solid-state imaging device 1 includes a pixel section (imaging area) 3, where a plurality of pixels 2 with photoelectric conversion elements are regularly arranged in two dimension on a semiconductor substrate (e.g., a silicon substrate) 11; and a peripheral circuit section. Each pixel (i.e., unit pixel) 2 includes a photoelectric conversion element such as a photodiode and a plurality of pixel transistors (MOS transistors). The plurality of pixel transistors may be three transistors, for example, a transfer transistor, a reset transistor, and an amplification transistor. Alternatively, four transistors may be provided including an additional selection transistor. The equivalent circuits of these unit pixels are the same as those well known in the art, so that the details thereof will be omitted in the following description.

The peripheral circuit section includes a vertical drive circuit 4, a column signal processing circuit 5, a horizontal drive circuit 6, an output circuit 7, a control circuit 8, and so on.

The control circuit 8 generates signals, such as clock signals and control signals to be referenced for driving the vertical drive circuit 4, the column signal processing circuit 5 and the horizontal drive circuit 6, and then inputs these signals to those circuits, respectively.

The vertical drive circuit 4, which is constructed of a shift register or the like, sequentially performs selective scanning of each of pixels 2 in the pixel section 3 one line at a time in the vertical direction. Then, the vertical drive circuit 4 supplies a pixel signal to the column signal processing circuit 5 through a vertical signal line 9. Here, the pixel signal is obtained based on a signal electric charge generated according to the amount of light received by the photoelectric conversion element (e.g., photodiode) of each pixel 2.

For example, the column signal processing circuit 5 is provided for every column of the pixels 2 and carries out signal processing, such as noise removal, of a signal output from each of the pixels 2 on one line with reference to a signal from a black reference pixel formed on the periphery of an effective pixel area. In other words, the column signal processing circuit 5 performs CDS for the removal of a fixed pattern noise specific to the pixel 2 and signal processing such as signal amplification. The output stage of the column signal processing circuit 5 is connected to a horizontal selection switch (not shown) which is located between the output stage and a horizontal signal line 10.

The horizontal drive circuit 6, which is constructed of a shift resister or the like, sequentially outputs horizontal scanning pulses, thereby selecting the respective column signal processing circuits 5 in order to output pixel signals. Then, the column signal processing circuits 5 are allowed to output pixel signals to the horizontal signal line 10. The output circuit 7 carries out signal processing on signals sequentially supplied from the respective column signal processing circuits 5 through the horizontal signal line 10 and then outputs the processed signals.

A plurality of wiring layers are formed above the semiconductor substrate 11, on which both the pixel section 3 and the peripheral circuit section are formed, through an insulating interlayer. In the pixel section 3, an on-chip color filter is formed above the plurality of wiring layers with a planarizing film in between. In addition, an on-chip microlens is formed above the on-chip color filter. A light-shielding film is formed above regions other than the pixel section of the imaging area. Specifically, the light-shielding film is formed in the regions including the peripheral circuit section and other regions except for the photodiode of the imaging area (light-sensing unit). Such a light-shielding film may be formed of, for example, the top wiring layer of the plurality of wiring layers.

The solid-state imaging device according to the present embodiment is applied to the CMOS solid-state imaging device as described above. However, it is not limited thereto.

Figure 4:
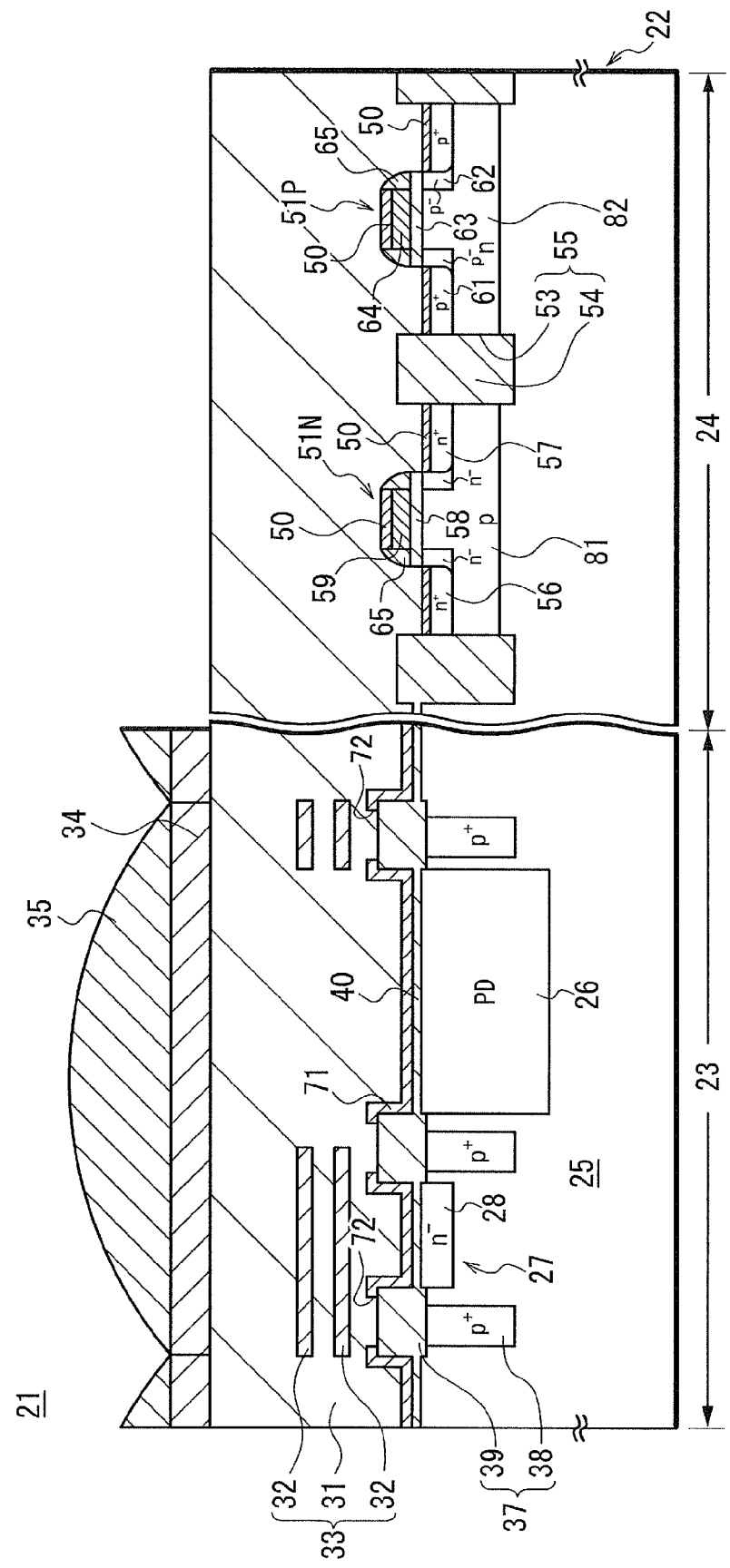
FIG. 4 is a cross-sectional view of a main part of a first example of a solid-state imaging device according to an embodiment of the present invention.
Figure 5:
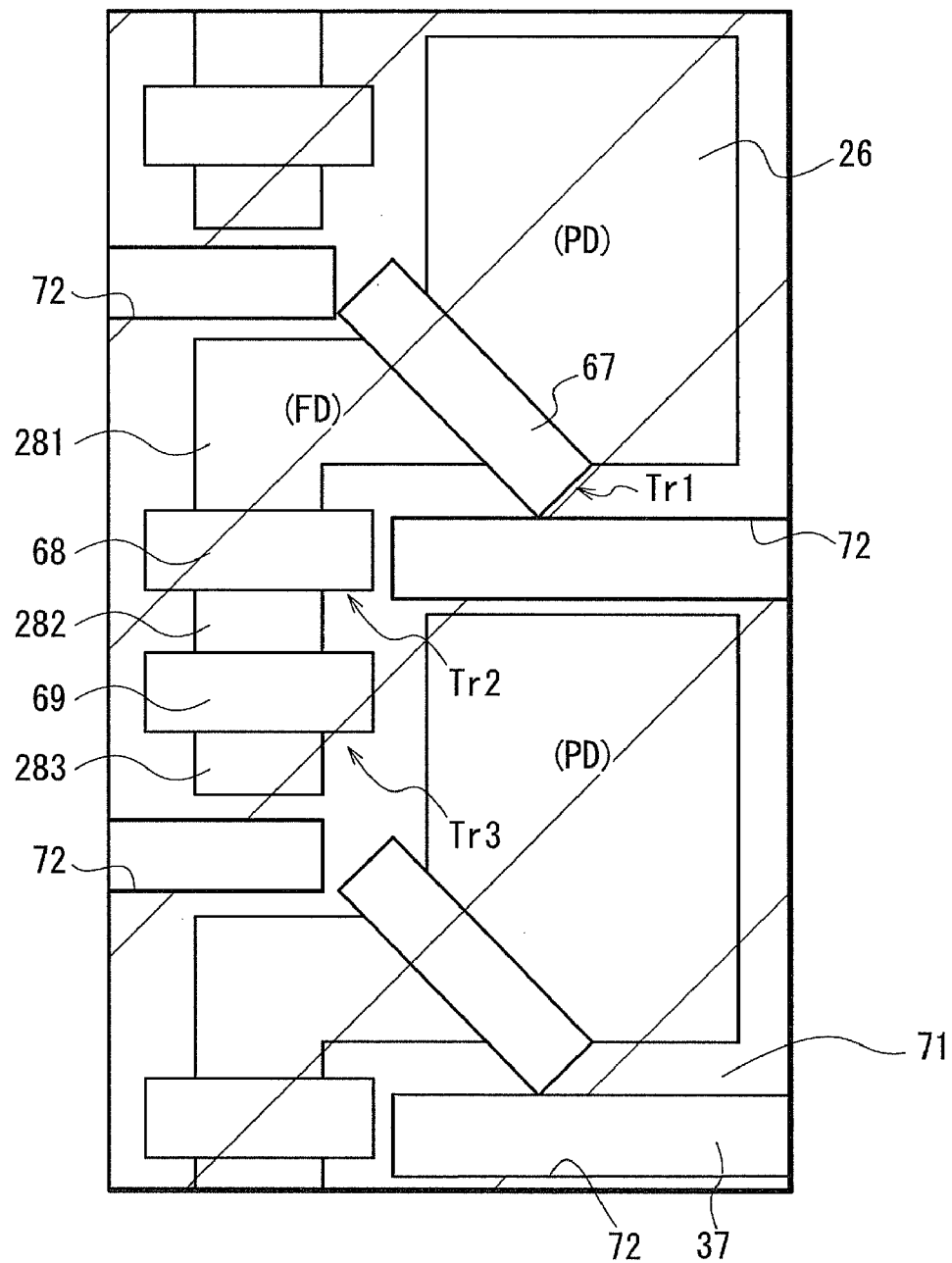
FIG. 5 is a plan view of a main part of a pixel section of the first example of the solid-state imaging device according to an embodiment of the present invention.

Referring now to FIG. 4 and FIG. 5, a first example of a solid-state imaging device according to an embodiment of the present invention will be described. FIG. 4 is a schematic view illustrating the main part of a pixel section (imaging area) 23 and the main part of a peripheral circuit section 24, which are formed on a semiconductor substrate (e.g., a silicon substrate) 22. FIG. 5 is a plan view of the main part of the pixel section 23 where a plurality of pixels are arranged. A solid-imaging device 21 of this example includes the pixel section 23 and the peripheral circuit section 24, which are formed on the semiconductor substrate 22. The pixel section 23 includes a plurality of pixels being arranged on the semiconductor substrate 22. The peripheral circuit section 24 includes a logic circuit or the like formed around the pixel section 23.

More specifically, in the pixel section 23, the pixels 25 are arranged in a matrix in a plane and each of them includes a photo diode (PD) as a photoelectric conversion element 26 and a plurality of pixel transistors 27. In FIG. 4, one pixel transistor 27 represents a plurality of pixel transistors. The pixel transistor 27 includes a source/drain area 28, a gate insulating film (not shown), and a gate electrode such as a polysilicon film (not shown). A plurality of wiring layers 33 are formed above the pixel 25 with an insulating interlayer 31 in between. The plurality of wiring layers 33 include a plurality of wiring lines 32 being layered via the insulating interlayer 31. Furthermore, an on-chip color filter 34 and an on-chip microlens 35 are formed above the plurality of wiring layers 33 via a planarizing film (not shown).

Figure 6A:
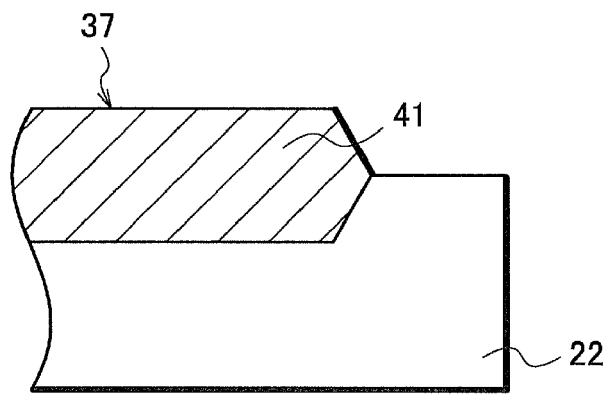
FIGS. 6A to 6C are cross-sectional views illustrating an isolation portion formed on a pixel section of the solid-state imaging device according to an embodiment of the present invention, where
Figure 6B:
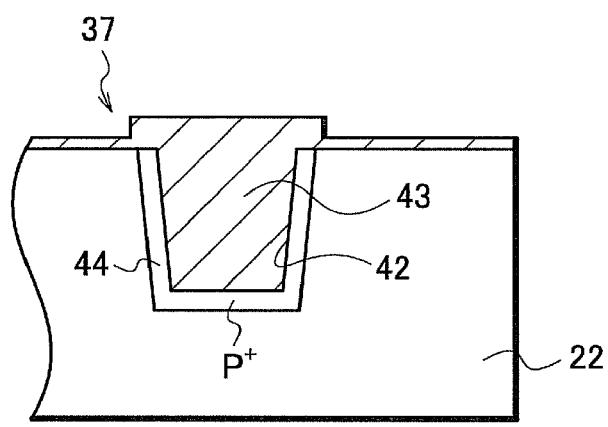
Figure 6C:
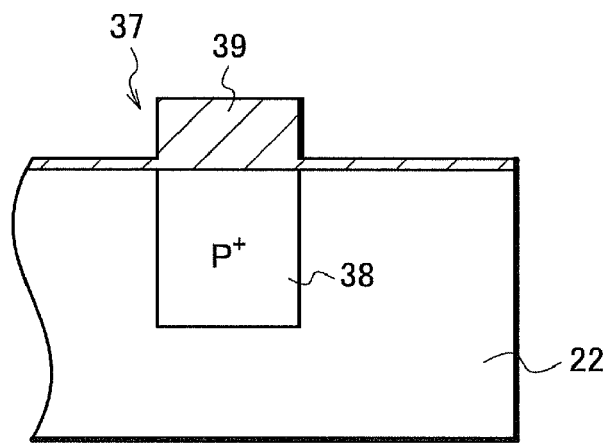

In this example, electrons are used as signal electric charges. Isolation portions 37 separate the pixels 25 from one another. The isolation portion 37 has an impurity diffusion isolation structure, including a p-type semiconductor layer 38 formed on the semiconductor substrate 22 and insulating layer 39 such as a silicon oxide film formed above the semiconductor layer 38. The isolation portion 37 in the pixel section 23 may have any kind of structures as shown in FIGS. 6A to 6C. For example, it may be an impurity diffusion isolation structure (see FIG. 6C) or may have an insulation/separation structure using a silicon oxide layer 41 by the Local Oxidation of Silicon (LOCOS) (see FIG. 6A). Alternatively, the isolation portion 37 may have a shallow-trench isolation (STI) structure as shown in FIG. 6B. In the STI structure, a groove 42 is formed in the semiconductor substrate 22 and then filled with an insulating layer 43 such as a silicon oxide film. As shown in FIG. 6B, a $p^+$ semiconductor layer 44 is formed near the interface between the insulating layer 43 and the semiconductor substrate 22.

The photodiode 26 includes a second conductivity-type region, that is, n-type charge accumulation region and a $p^+$ semiconductor region (hole accumulation layer), in a first conductivity-type, that is, p-type semiconductor well region of the semiconductor substrate 22. The p⁺ semiconductor region is provided for suppressing dark current and formed near the interface between the n-type charge accumulation region and an insulating film (e.g., a silicon oxide film) 40 formed thereon.

In the peripheral circuit section 24, a logic circuit is constructed of a CMOS transistor that includes an n-channel MOS transistor 51N and a p-channel MOS transistor 51P. Similarly to the pixel section 23, a plurality of wiring layers are formed such that a plurality of wiring lines is formed with the insulating interlayer 31 in between. An isolation portion 55 with the STI structure separates the MOS transistors 51N and 51P from each other. The isolation portion 55 may be formed by filling the groove 53 formed in the semiconductor substrate 22 with, for example, a silicon oxide layer 54.

The n-channel MOS transistor 51N includes a pair of n-type source/drain regions 56 and 57 formed on a p-type semiconductor well region 81, a gate insulating film 58, and a gate electrode (e.g., a polysilicon film) 59. The p-channel MOS transistor 51P includes a pair of p-type source/drain regions 61 and 62 formed on an n-type semiconductor well region 82, a gate insulating film 63, and a gate electrode (e.g., a polysilicon film) 64. A sidewall (sidewall layer) 65, an insulating film, is formed on the side wall of each of the gate electrodes 59 and 64 of the n-channel MOS transistor 51N and the p-channel MOS transistor 51P. Each of the source/drain regions 56, 57, 61, and 62 includes a highly-doped region and a lightly-doped region.

According to this example, as shown in FIG. 5, the pixel 25 includes a photodiode as a photoelectric conversion element 26 and three pixel transistors, i.e., a transfer transistor Tr1, a reset transistor Tr2 and an amplification transistor Tr3. The transfer transistor Tr1 includes a source/drain region 281, which becomes a floating diffusion (FD) region with the photodiode 26, and a transfer gate electrode 167. The reset transistor Tr2 includes a pair of source/drain regions 281 and 282 and a reset gate electrode 68. The amplification transistor Tr3 includes a pair of source/drain regions 282 and 283 and an amplification gate electrode 69.

Furthermore, in this example, a silicide blocking layer 71 is formed in the pixel section 23 but part thereof is removed. Thus, the silicide blocking layer 71 is not formed throughout the pixel section 23. In other words, the silicide blocking layer 71 is formed in the pixel section 23 except for areas above part or whole of the isolation portion 37. According to the example, an opening 72 is formed in part of the deposited silicide blocking layer 71 toward part of the insulating layer 39 of the isolation portion 37. In this case, the opening 72 is not formed above the portions of the respective electrodes 67 to 69 extending over the isolation portion 37. Therefore, the metal silicide layer is not formed in the pixel section 23.

On the other hand, a metal silicide layer 50 is formed on the respective n- and p-channel MOS transistors 51N and 51P of the CMOS transistors in the peripheral circuit section 24. The metal silicide layer 50 is formed by reacting silicon with a refractory metal. In other words, the metal silicide layer 50 is formed on the surfaces of the respective source/drain regions 56, 57, 61, and 62 and the surfaces of the respective polysilicon gate electrodes 59 and 64. The metal silicide layer 50 may be a refractory metal silicide, such as a Co silicide layer.

Referring to FIGS. 7 to 12, according to another embodiment of the present invention, there will be described a method of manufacturing the solid-state imaging device 21 of the above-described embodiment.

Figure 7:
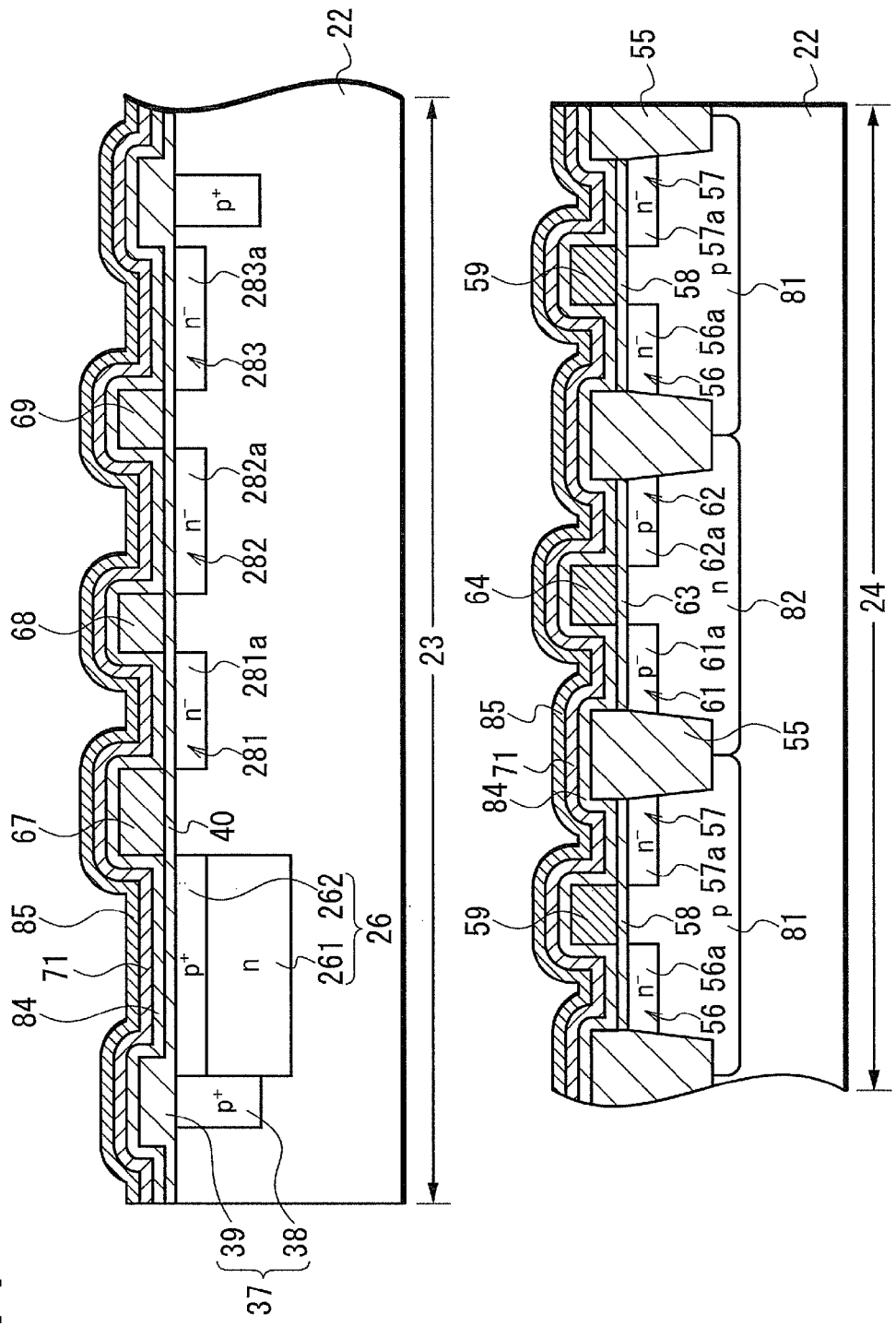
FIG. 7 is a diagram illustrating a step of manufacturing a solid-state imaging device according to an embodiment of the present invention (1/6).

First, as shown in FIG. 7, the isolation portion 37 is formed in the pixel section 23 of the semiconductor substrate 22. Here, the isolation portion 37 includes the p-type semiconductor layer 38 and the insulating layer 39. On areas divided by the isolation portions 37 are provided gate electrodes, 67, 68, and 69 for a plurality of pixel transistors, i.e., a transfer transistor Tr1, a reset transistor Tr2, and an amplification transistor Tr3, respectively, with a gate insulating film 40 such as a silicon dioxide film. The isolation portions 37 and the gate electrodes 67 to 69 are used as masks to form a photodiode (PD) 26 and source/drain regions 281, 282, and 283, respectively. The photodiode 26 includes an n-type charge accumulation region 261, and a p⁺ semiconductor layer 262 formed thereon for suppressing the generation of dark current. The isolation portion 37 and the gate electrodes 67 to 69 are used as masks to form lightly-doped regions 281a, 282a, and 283a, which are parts of the respective n-type source/drain regions 281 to 283 on the semiconductor substrate 22.

On the other hand, the isolation portion 55 with the STI structure is formed in the peripheral circuit section 24. The p-type semiconductor well region 81 and the n-type semiconductor well region 82 are formed on the semiconductor substrate 22, while being isolated by the isolation portion 55. The gate electrodes 59 and 64 are respectively formed on the p-type semiconductor well region 81 and the n-type semiconductor well region 82 with the gate insulating films 58 and 63, such as silicon dioxide film in between. The isolation portion 55 and the gate electrodes 69 and 64 are used as masks to form lightly-doped regions 56a and 57a, which are parts of the respective n-type source/drain regions 56 and 57 in pair, on the p-type semiconductor well region 81 by ion implantation. Similarly, lightly-doped regions 61a and 62a, which are parts of the respective p-type source/drain regions 61 and 62 in pair, are formed on the n-type semiconductor well region 82 by ion implantation.

Subsequently, a plurality of insulating films are stacked on top of one another in order on the entire surface of the semiconductor substrate 22. In other words, the plurality of insulating films include a first insulating film (e.g., a silicon dioxide film 84), a second insulating film (e.g., a silicide blocking layer 71) such as a silicon nitride film, and a third insulating film (e.g., a silicon dioxide film 85).

Figure 8:
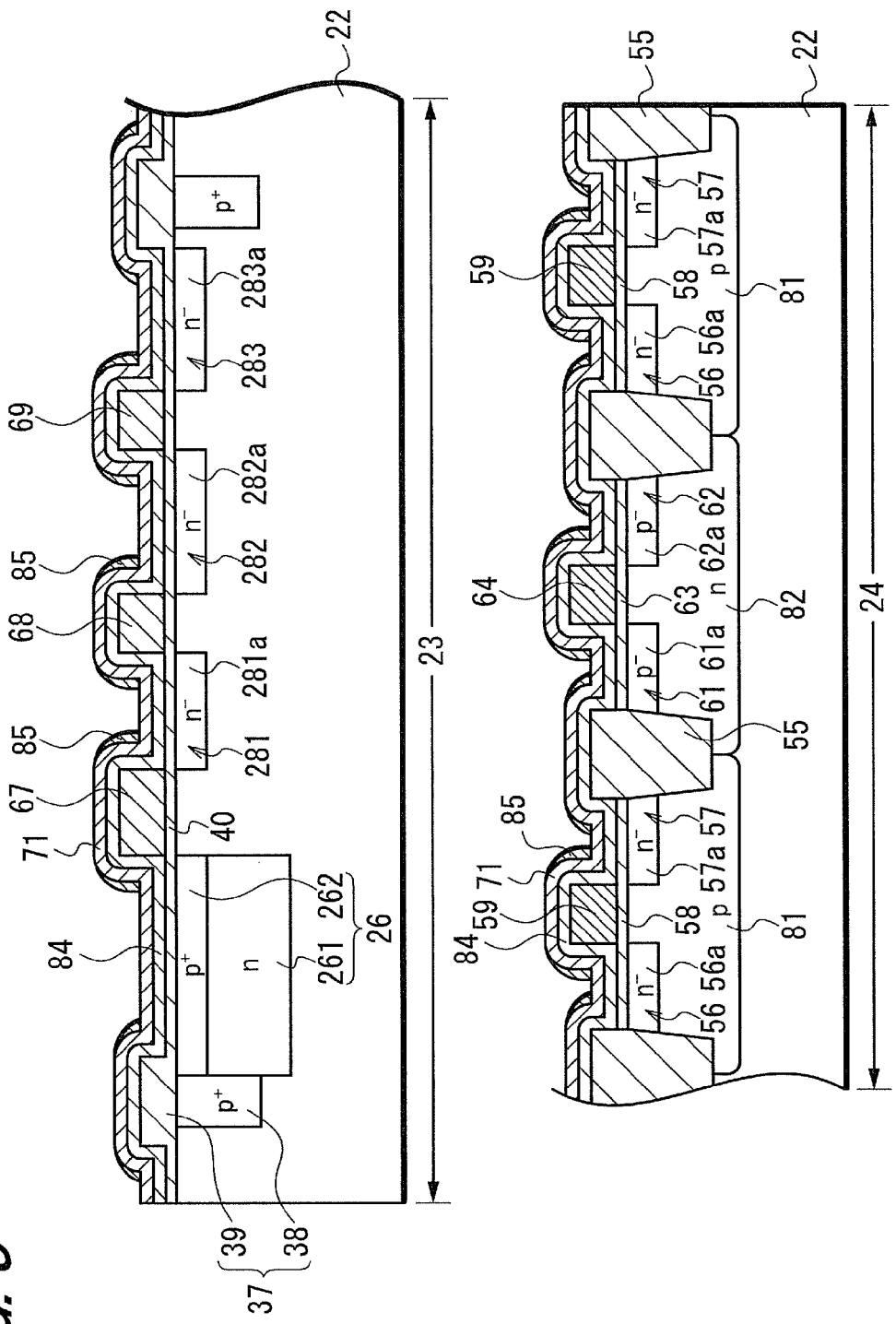
FIG. 8 is a diagram illustrating a step of manufacturing the solid-state imaging device according to an embodiment of the present invention (2/6).

Next, as shown in FIG. 8, the silicon dioxide film (third insulating film) 85 is etch-backed so that the silicon dioxide film 85 only remains on the side walls of the respective gate electrodes 67 to 69 in the pixel section 23. Simultaneously, the silicon dioxide film 85 are only left on the side walls of the respective gate electrodes 59 and 64 in the peripheral circuit section 24.

Figure 9:
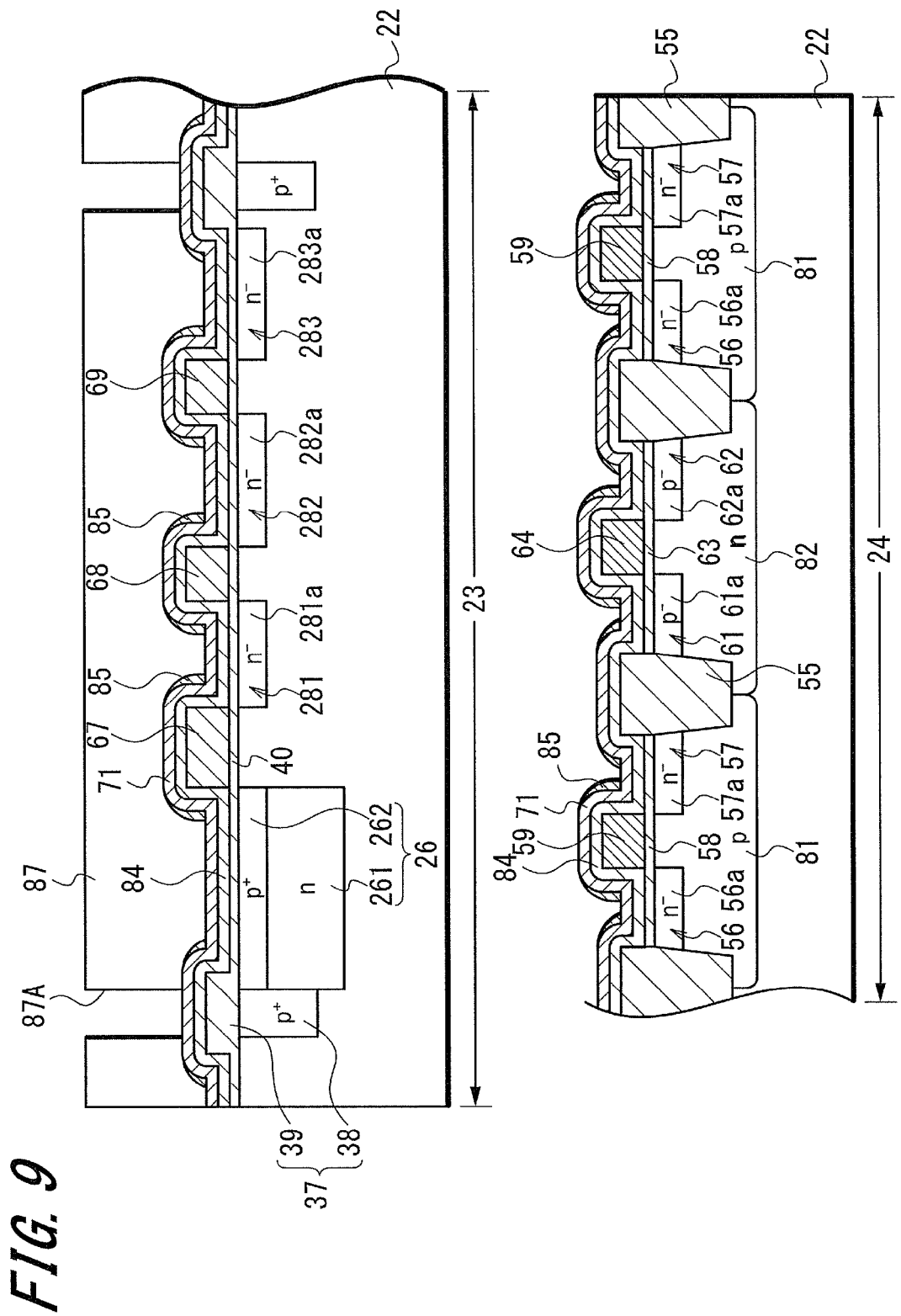
FIG. 9 is a diagram illustrating a step of manufacturing the solid-state imaging device according to an embodiment of the present invention (3/6).

Furthermore, as shown in FIG. 9, a resist mask 87 having an opening 87A in an area above part or whole of the isolation portion 37 is formed in the pixel section 23. In this embodiment, a resist mask 87 is formed such that the opening 87A is formed only in an area above part of the isolation portion 37 (see FIG. 5).

Figure 10:
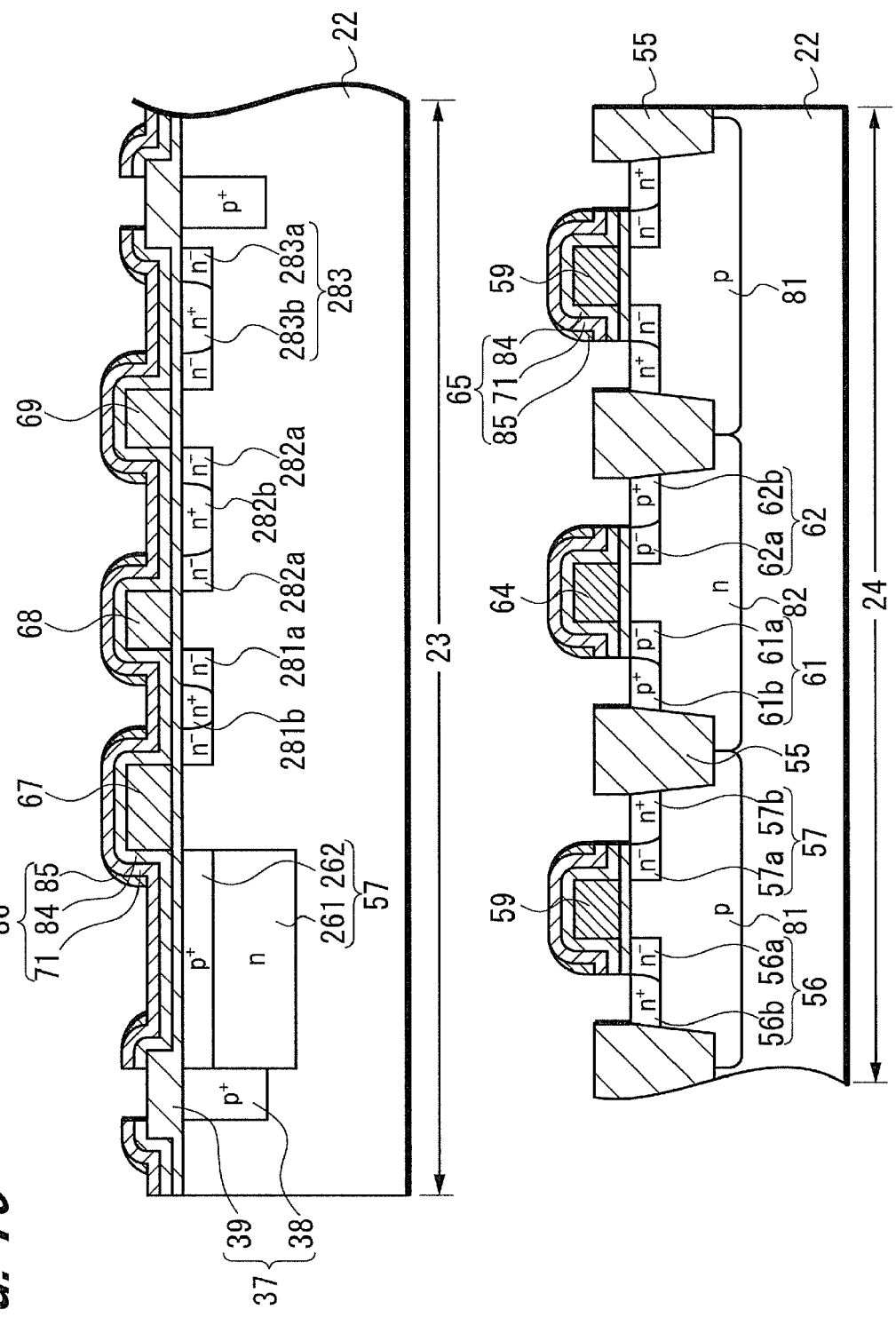
FIG. 10 is a diagram illustrating a step of manufacturing the solid-state imaging device according to an embodiment of the present invention (4/6).

Next, etching is carried out in such conditions and the resist is then removed. As a result, as shown in FIG. 10, both the silicide blocking layer 71 and the silicon dioxide film 84 under the film 71 toward the opening 87A of the resist mask 87 are selectively removed to expose the insulating layer 39 of the isolation portion 37. The sidewall (sidewall layer) 65 with a three-layered structure is formed on the side walls of the respective gate electrodes 59 and 64 in the peripheral circuit section 24. The sidewall layer 65 includes the silicon dioxide film 84 as the first insulating film, the silicide blocking layer 71 as the second insulating film, and the silicon dioxide film 85 as the third insulating film. The surfaces of the respective gate electrodes 59 and 64 made of polysilicon and the surfaces of the respective source/drain regions 56, 57, 61, and 62 in the peripheral circuit section 24 are exposed.

In the peripheral circuit section 24, highly-doped regions 56b and 57b to be provided as parts of the respective n-type source/drain regions 56 and 57 and highly-doped regions 61b and 62b to be provided as parts of the p-type source/drain regions 61 and 62 are selectively formed by ion implantation using the gate electrodes 59 and 64, the sidewall 65, and the isolation portion 55 with the STI structure, respectively. On the other hand, in the pixel section 23, a sidewall (sidewall layer) 86 with a three-layered structure is formed on each of the side walls of the respective gate electrodes 67 to 69. The three-layered structure includes the silicon dioxide film 84 as the first insulating film, the silicide blocking layer 71 as the second insulating film, and the silicon dioxide film 85 as the third insulating film. Both the sidewall 86 and the gate electrodes 67 to 69 are used as masks to form highly-doped regions 281b to 283b to be provided as parts of the respective n-type source/drain regions 281 to 283.

Figure 11:
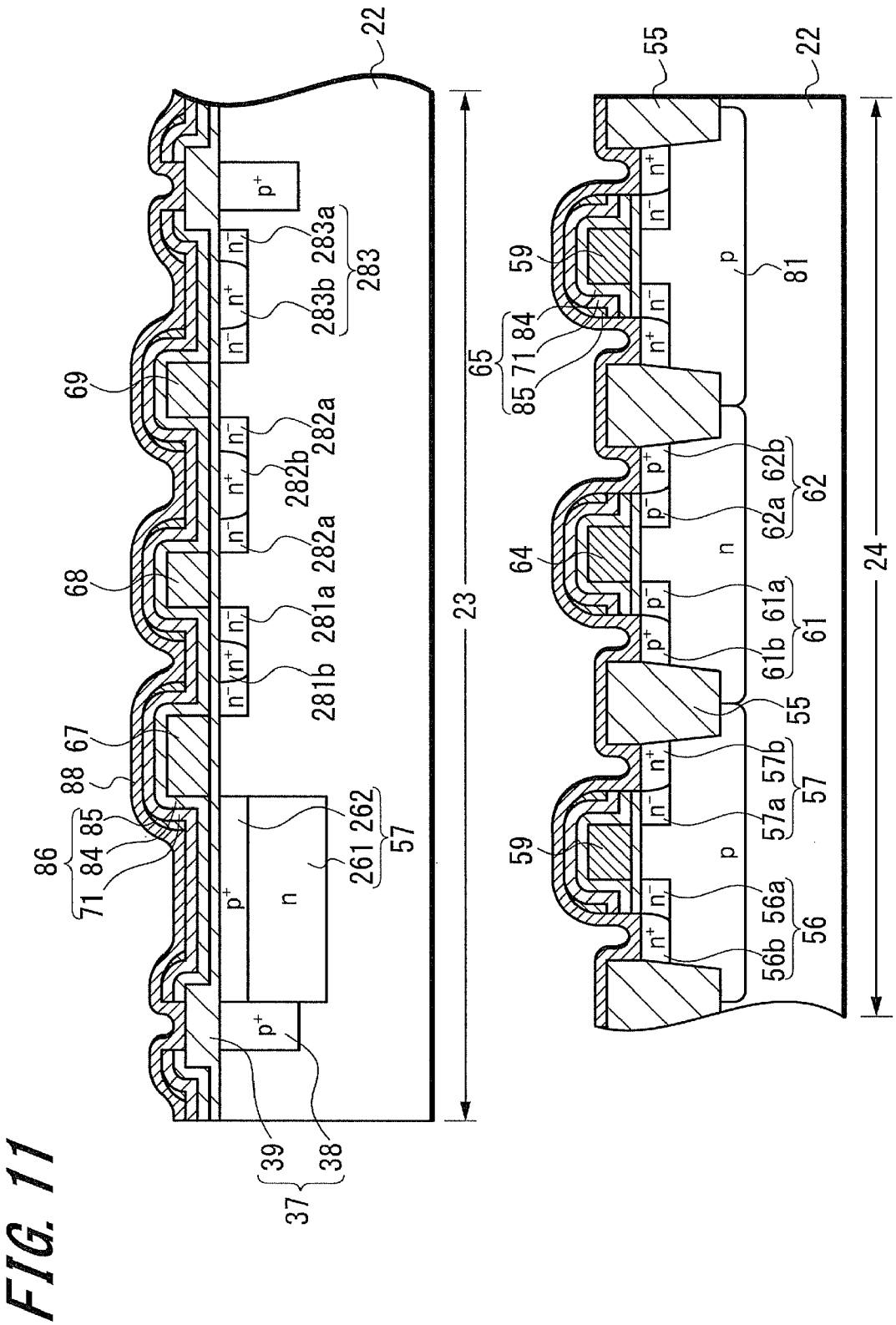
FIG. 11 is a diagram illustrating a step of manufacturing the solid-state imaging device according to an embodiment of the present invention (5/6).

Subsequently, as shown in FIG. 11, a refractory metal film such as a cobalt (Co) film 88 is deposited on the whole surfaces of the pixel section 23 and the peripheral circuit section 24.

Figure 12:
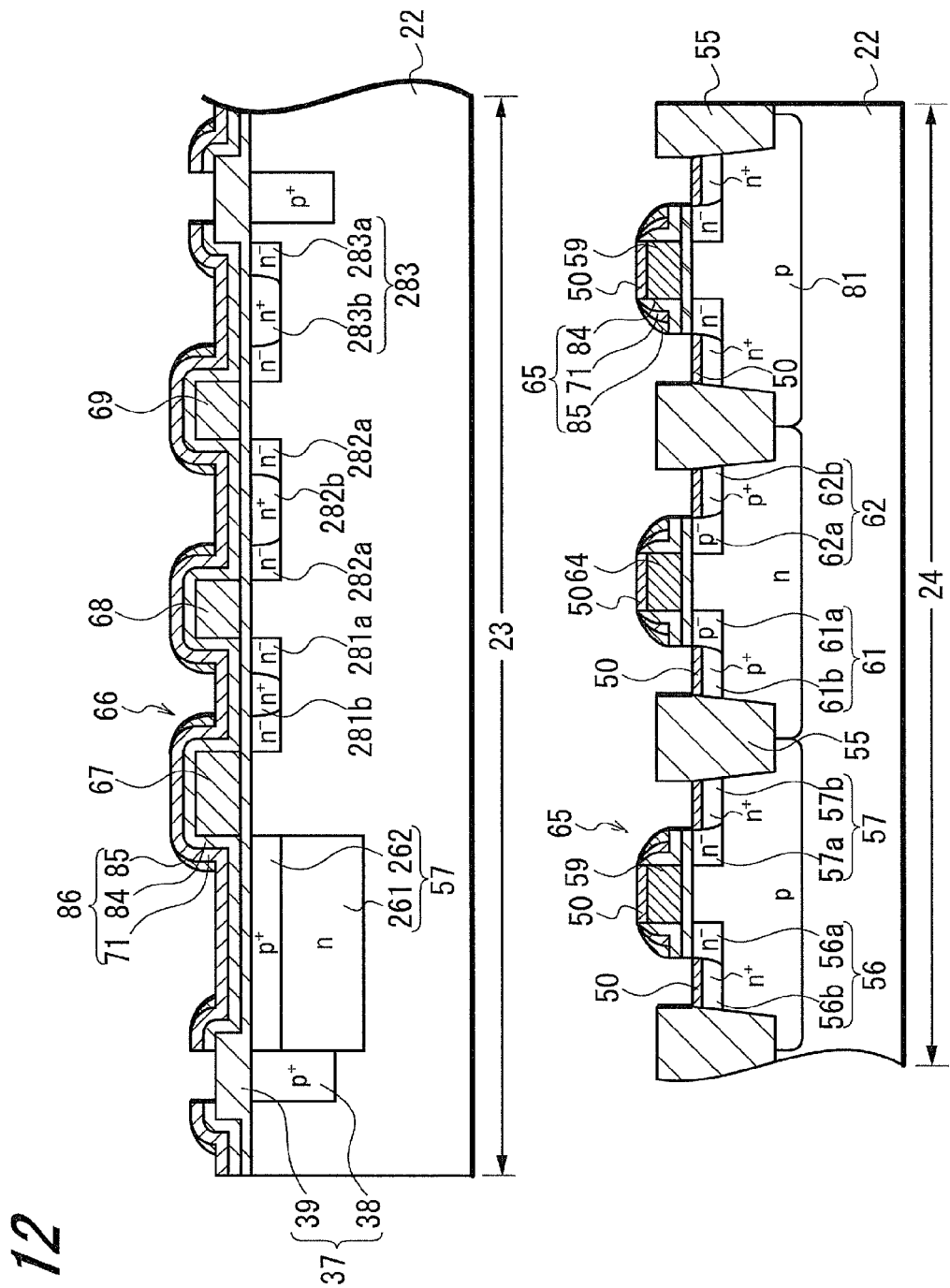
FIG. 12 is a diagram illustrating a step of manufacturing the solid-state imaging device according to an embodiment of the present invention (6/6).

As shown in FIG. 12, heat treatment is carried out and in the peripheral circuit section 24, cobalt (Co) is allowed to react with silicon regions, that is, the surfaces of the respective gate electrodes 59 and 64 and the surfaces of the respective n- and p-type source/drain regions 56, 57, 61, and 62, which are being contacted with the film 88. As a result, the metal silicide layer (i.e., a Co-silicide layer) 50 is formed on the surfaces of the respective gate electrodes 59 and 64 and the surfaces of the respective n- and p-type source/drain regions 56, 57, 61, and 62. In the pixel section 23, on the other hand, the co-silicide layer 50 is not formed, because the cobalt (Co) film 88 is deposited on the insulating layer 39 of the isolation portion 37 and also on the silicide blocking layer 71. After the silicidation, a residual of the cobalt (Co) film 88 is removed.

Accordingly, in the peripheral circuit section 24, a CMOS transistor constructed of a silicided n-channel MOS transistor 51N and p-channel MOS transistor 51P is formed. In the pixel section 23, a pixel constructed of an unsilicided photodiode 26 and pixel transistors Tr1 to Tr3 is formed. Thus, the desired solid-state imaging device 21 is obtained where, because of the opening 72, a part of the isolation portion 37 in the pixel section 23 has an area on which the silicide blocking layer 71 is not formed.

According to the solid-state imaging device 21 of a first example, the silicided MOS transistors 51N and 51P are formed in the peripheral circuit section 24 and the silicide-free pixels are formed with the silicide blocking layer 71 in the pixel section 23. Furthermore, in the pixel section 23, the opening 72 is formed in an area above the isolation portion 37 by removing part of the silicide blocking layer 71. The silicide blocking layer 71 is not formed all over the pixel section 23, but portions from which the silicide blocking layer 71 was removed are distributed as a whole. In other words, the area covered with the silicide blocking layer 71 is reduced, so that the warping of the semiconductor substrate caused by the heat treatment for silicidation can be reduced. Therefore, there is no stress caused by the warping of the substrate, so that the generation of noise due to the stress can be suppressed. Even if the cobalt (Co) film 88 is applied to the isolation portion 37 in the pixel section 23, such cobalt (Co) film 88 can be removed after the silicidation and a Co silicide layer is not formed in the pixel section 23. Therefore, the resulting solid-state imaging device is prevented from generating junction leakage in the pixel and being contaminated by the Co silicide layer as well as from generating dark current and white spots.

In the production of the solid-state imaging device 21 according to the embodiment, the step of partially removing the silicide blocking layer 71 in the pixel section 23 is carried out simultaneously with the removal of the silicide blocking layer 71 in the peripheral circuit section 24. Thus, there is no need to increase the number of manufacturing steps. In the pixel section 23, the silicide blocking layer 71 also serves as the sidewall 86 of the gate electrode of the pixel transistor and in the peripheral circuit section 24 the film 71 also serves as the sidewall 65 of the gate electrode. Thus, the number of manufacturing steps can be reduced.

Therefore, according to the present embodiment, the pixel quality can be improved without an increase in the number of manufacturing steps.

Figure 13:
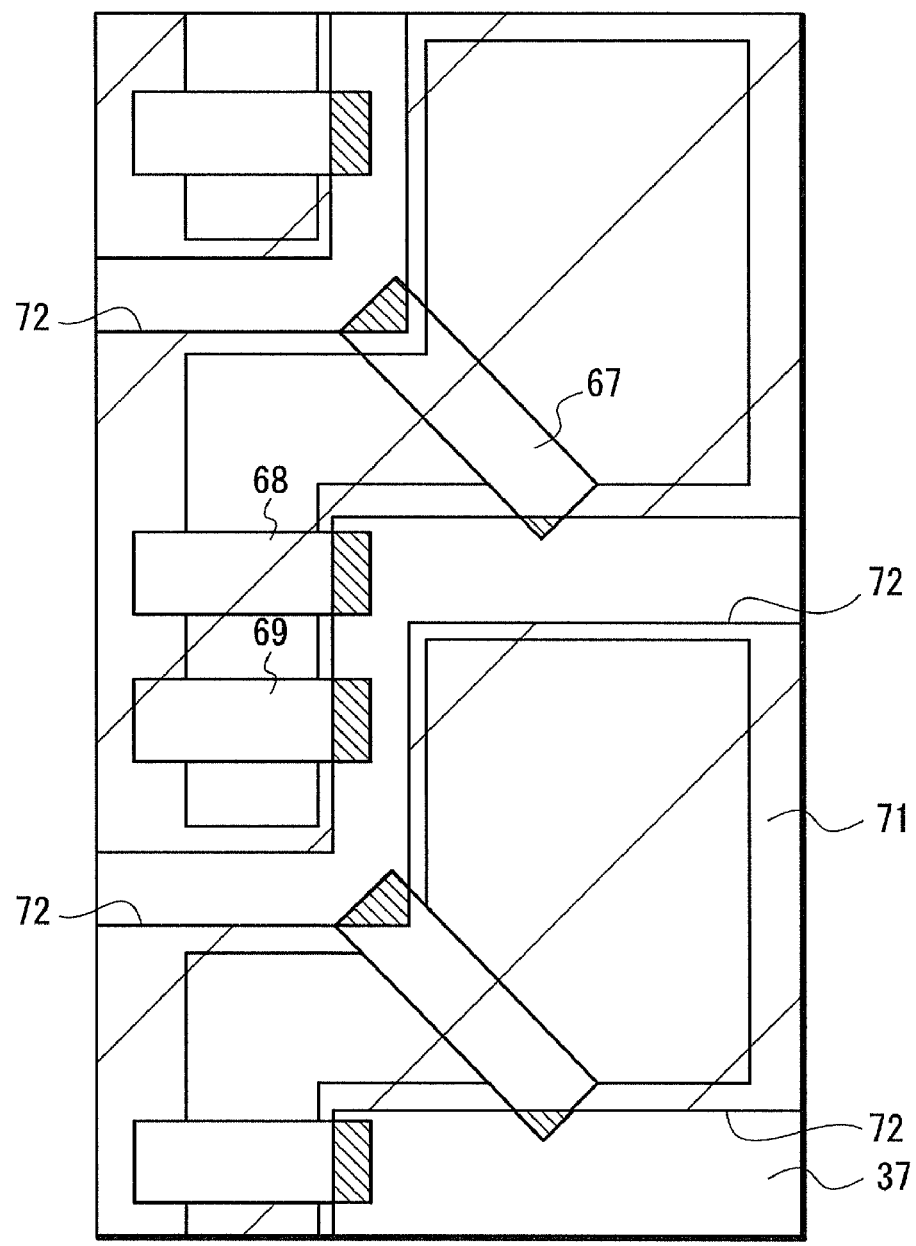
FIG. 13 is a plan view of a main part of a pixel section of a second example of a solid-state imaging device according to an embodiment of the present invention.

Referring now to FIG. 13, a second example of a solid-state imaging device according to an embodiment of the present invention will be described. FIG. 13 illustrates a plan view of the main part of the pixel section 23, where a plurality of pixels are arranged, similar to the case of the first example illustrated in FIG. 5 except for the followings. In a solid-state imaging device 91 of this example, the silicide blocking layer 71 is not entirely formed on the surface of the pixel section. The silicide blocking layer 71 is formed in the pixel section except for areas above the isolation portion 37 and the portion of the gate electrode of the pixel transistor extending over the isolation portion 37. In other words, the openings 72 are formed only in portions of the silicide blocking layer 71 in the pixel section 23, where such portions are located above the isolation portion 37 and above the portions of the transfer gate electrode 67, the reset gate electrode 68, and the amplification gate electrode 69, extending over the isolation portion 37. The opening 72 toward the extending portion of the gate electrode is formed apart from the semiconductor region of the pixel transistor, thereby preventing the opening 72 from being enlarged to the semiconductor region of the pixel transistor.

Furthermore, in the step of silicidation in the peripheral circuit section 24, the extending portion of the gate electrode that is not covered with the silicide block film 71 is simultaneously silicided. As a result, for example, a Co silicide layer 50 is formed.

Other structural features of the solid-state imaging device 91 of this example are the same as those of the aforementioned first example. The same reference symbols as in FIG. 5 are used to denote the corresponding or similar portions. Thus, redundant descriptions will be omitted.

The method of manufacturing the solid-state imaging device 91 according to the second example is similar to the method described above. This method includes the step of partially removing the silicide blocking layer as illustrated in FIGS. 9 and 10 where the pattern of the openings 72 is formed such that the portions of the respective electrodes 67 to 69 extending over the isolation portion 37 are exposed. The other steps are similar to those of the aforementioned manufacturing method. Thus, the solid-state imaging device 91 of the second example can be produced.

In the solid-state imaging device 91 of the second example, the silicide blocking layer 71 is formed such that the opening 72 thereof is only formed above the isolation portion 37 and above the portion of the gate electrode extending over the isolation portion 37. The metal silicide layer 50 is formed on the extending portion of the gate electrode facing the opening 72. However, the metal silicide layer 50 is not formed on the silicon substrate directly connecting to the photodiode 26. Therefore, there is no deterioration of the pixel property due to the metal silicide layer 50 formed on the extending portion of the gate electrode.

The opening 72 of the silicide blocking layer 71 is formed in the area including the portion of the gate electrode extending over the isolation portion 37. Thus, the area of the opening 72 can be increased. Accordingly, the semiconductor substrate 22 can be prevented from warping to the extent corresponding thereto. In addition, the same advantageous effects as those of the first example can be obtained.

There is provided a third example of the solid-state imaging device according to an embodiment of the present invention. Although not shown in the figure, according to the third example, the silicide blocking layer 71 is not entirely formed on the surface of the pixel section but formed in the pixel section except for areas above the isolation portion 37 and the gate electrode of the pixel transistor. In other words, the opening 72 is formed in the silicide blocking layer 71 above the isolation portion 37 and above a part or whole of the transfer gate electrode 67, the reset gate electrode 68, and the amplification gate electrode 69.

In the step of silicidation of the peripheral circuit section 24, the gate electrode which has not been covered with the silicide blocking layer 71 in the pixel section 23 is also silicided simultaneously with the silicidation in the peripheral circuit section 24. As a result, for example, the Co silicide layer 50 is formed.

Other structural features of the solid-state imaging device of this example are the same as those of the aforementioned first example. The same reference symbols as in FIG. 5 are used to denote the corresponding or similar portions. Thus, redundant descriptions will be omitted.

According to the third example of the solid-state imaging device of an embodiment of the present invention, the same advantageous effects as those of any of the aforementioned examples can be obtained.

The solid-state imaging device of an embodiment of the present invention can be applied to a linear image sensor as well as an area image sensor such as one as exemplified in the above description.

The solid-state imaging devices according to an embodiment of the present invention can be applied to electronic apparatuses including a camera including a solid-state imaging device, a camera cell-phone, and other devices including a solid-state imaging device.

Figure 14:
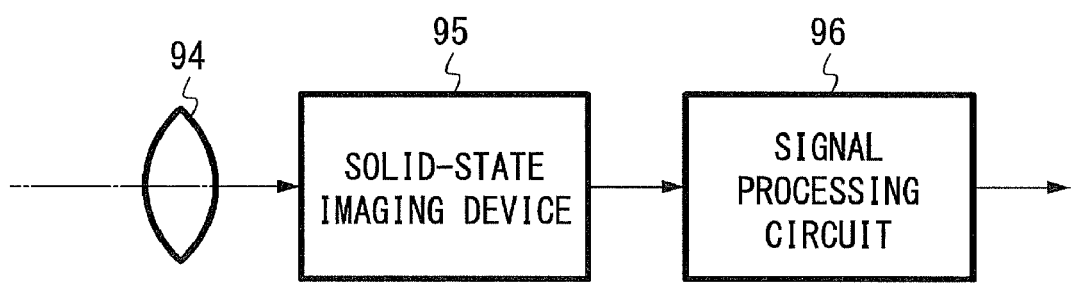
FIG. 14 is a schematic diagram illustrating the configuration of an electronic apparatus according to an embodiment of the present invention.

FIG. 14 illustrates the configuration of a camera as an example of electronic apparatus according to an embodiment of the present invention. A camera 93 of this example includes an optical system (optical lens) 94, a solid-state imaging device 95, and a signal processing circuit 96. Any of the aforementioned examples of solid-state imaging device can be used as the solid-state imaging device 95. The optical system 94 focuses image light (incident light) from an object onto an imaging area of the solid-state imaging device 95. Therefore, signal electric charges are accumulated in a photoelectric conversion elements of the solid-state imaging device 95 for a given period of time. The signal processing circuit 96 carries out various kinds of signal processing on signals output from the solid-state imaging device 95 and outputs the resultant signals. The camera 93 of this example may be designed as a camera module in which the optical system 94, the solid-state imaging device 95, and the signal processing circuit 96 are modularized.

According to an embodiment of the present invention, a mobile device including a camera, such as a mobile phone unit including the camera or camera module of FIG. 14, can be provided. Furthermore, according to the configuration illustrated in FIG. 14, a module with an imaging function in which the optical system 94, the solid-state imaging device 95, and the signal processing circuit 96 are modularized can be provided. According to an embodiment of the present invention, an electronic apparatus including such imaging function can be provided.

Accordingly, the electronic apparatus of the present embodiment can be excellent in pixel property of the solid-state imaging device and obtain an image with high quality, being provided as a high-performance electronic apparatus.

The above examples of solid-state imaging device of the present embodiment have been described as one with an array of pixels each including one photodiode and a plurality of pixel transistors. Alternatively, the solid-state imaging device of the present embodiment may be one including an array of shared pixels where each pixel has one photodiode and one transfer transistor and the other pixel transistors are shared with a plurality of pixels.

Although any of the above examples has been applied to the solid-state imaging device in which electrons are used as signal electric charges, it may be applied to one using electron holes as signal electronic charges.

The present application contains subject matter related to that disclosed in Japanese Priority Patent Application JP 2008-110669 filed in the Japanese Patent Office on Apr. 21, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, comprising the steps of:
    forming a silicide blocking layer in a pixel section with a plurality of pixels, each pixel having a photoelectric conversion element and a pixel transistor, the silicide blocking layer covering each pixel, isolation portions disposed between adjacent pixels;
    selectively removing the silicide blocking layer from a part or an entire area above the isolation portions in the pixel section while the silicide blocking layer remains on the photoelectric conversion element;
    forming a metal film in the pixel section and a peripheral circuit section with the silicide blocking layer covering the photoelectric conversion element;
    forming a metal silicide layer in the peripheral circuit section by siliciding a portion of the metal film; and
    removing a residual of the metal film not silicided,
    wherein,
        the silicide blocking layer is configured to protect the photoelectric conversion element when the metal silicide layer is formed.

2. The method of manufacturing a solid-state imaging device according to claim 1, further comprising:
    selectively removing the silicide blocking layer above a gate electrode of the pixel transistor prior to said step of forming the metal film; and
    forming the metal silicide layer on the gate electrode of the pixel transistor prior to said step of removing the residual of the metal film.

3. The method of manufacturing a solid-state imaging device according to claim 1, wherein the silicide blocking layer is formed in the pixel section so that the silicide blocking layer serves as a sidewall layer of the gate electrode of the pixel transistor.

* * * * *